(12) United States Patent
Jang et al.

(10) Patent No.: US 12,525,479 B2
(45) Date of Patent: Jan. 13, 2026

(54) SUBSTRATE LOADING APPARATUS, SEMICONDUCTOR MANUFACTURING EQUIPMENT INCLUDING THE SAME, AND METHOD OF MANUFACTURING A SEMICONDUCTOR PACKAGE USING THE SEMICONDUCTOR MANUFACTURING EQUIPMENT

(71) Applicant: Samsung Electronics Co., Ltd., Suwon-si (KR)

(72) Inventors: Sangho Jang, Suwon-si (KR); Dongsoo Lee, Suwon-si (KR); Kibeom Kil, Suwon-si (KR); Yeongseok Kim, Suwon-si (KR); Wooram Oh, Suwon-si (KR); Youngshin Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 418 days.

(21) Appl. No.: 18/177,300

(22) Filed: Mar. 2, 2023

(65) Prior Publication Data

US 2024/0047253 A1    Feb. 8, 2024

(30) Foreign Application Priority Data

Aug. 4, 2022  (KR) ........................ 10-2022-0097518

(51) Int. Cl.
*H01L 21/677*    (2006.01)
*B65G 47/90*    (2006.01)
(Continued)

(52) U.S. Cl.
CPC ........ *H01L 21/6773* (2013.01); *B65G 47/901* (2013.01); *H01L 21/67144* (2013.01);
(Continued)

(58) Field of Classification Search
CPC ................ H01L 21/68; H01L 21/6773; H01L 21/67706; H01L 21/67715;
(Continued)

(56) References Cited

U.S. PATENT DOCUMENTS

2013/0230375 A1*  9/2013  Tung ................ H01L 21/67733
414/592
2020/0058534 A1*  2/2020  Kuo ................ H01L 21/67745
(Continued)

FOREIGN PATENT DOCUMENTS

KR    10-0273699 B1    12/2000
KR    10-0988229 B1    10/2010
(Continued)

*Primary Examiner* — Kaitlin S Joerger
(74) *Attorney, Agent, or Firm* — Fish & Richardson P.C.

(57) ABSTRACT

A substrate loading apparatus includes a pickup apparatus configured to move a magazine in a first direction, a second direction and a third direction, an elevator defining a plurality of waiting spaces, a stage configured to support the magazine, and an insert apparatus configured to transfer substrates in the magazine. At least one of the plurality of waiting spaces of the elevator is configured to selectively receive the magazine, and the pickup apparatus is spaced apart from the elevator and the stage in the third direction.

19 Claims, 18 Drawing Sheets

(51) Int. Cl.
*H01L 21/67* (2006.01)
*H05K 13/00* (2006.01)

(52) U.S. Cl.
CPC .. *H01L 21/67736* (2013.01); *H01L 21/67742* (2013.01); *H01L 21/67757* (2013.01); *H05K 13/0061* (2013.01)

(58) Field of Classification Search
CPC ......... H01L 21/67769; H01L 21/67766; H01L 21/67775; H01L 21/67259; H01L 21/6732
See application file for complete search history.

(56) References Cited

U.S. PATENT DOCUMENTS

| | | | | |
|---|---|---|---|---|
| 2021/0098275 A1* | 4/2021 | Li | .................... | H01L 21/67253 |
| 2021/0138911 A1* | 5/2021 | Mizutani | .......... | H01L 21/67733 |
| 2021/0166963 A1* | 6/2021 | Mitani | ................ | H01L 21/6773 |
| 2021/0202277 A1* | 7/2021 | Kuo | .................. | H01L 21/67766 |
| 2021/0407826 A1* | 12/2021 | Huang | .............. | H01L 21/67736 |
| 2022/0246450 A1* | 8/2022 | Teng | .................. | H01L 21/67712 |
| 2023/0052015 A1* | 2/2023 | Lee | .................. | H01L 21/67733 |
| 2023/0061872 A1* | 3/2023 | Kim | .................. | H01L 21/67733 |
| 2023/0140218 A1* | 5/2023 | Kobayashi | ........ | H01L 21/67379 |
| | | | | 414/814 |
| 2024/0178030 A1* | 5/2024 | Lin | .................. | H01L 21/67775 |
| 2025/0115440 A1* | 4/2025 | Tomida | ............. | H01L 21/6773 |
| 2025/0122022 A1* | 4/2025 | Yun | ..................... | H01L 21/6773 |

FOREIGN PATENT DOCUMENTS

| | | |
|---|---|---|
| KR | 10-2012-0008310 A | 1/2012 |
| KR | 10-1747756 B1 | 6/2017 |
| KR | 10-1830921 B1 | 3/2018 |
| KR | 10-2053752 B1 | 12/2019 |
| KR | 10-2140869 B1 | 8/2020 |
| KR | 10-2176282 B1 | 11/2020 |
| KR | 10-2182374 B1 | 11/2020 |

* cited by examiner

SUBSTRATE LOADING APPARATUS, SEMICONDUCTOR MANUFACTURING EQUIPMENT INCLUDING THE SAME, AND METHOD OF MANUFACTURING A SEMICONDUCTOR PACKAGE USING THE SEMICONDUCTOR MANUFACTURING EQUIPMENT

CROSS-REFERENCE TO RELATED APPLICATION

This U.S. non-provisional patent application claims priority under 35 U.S.C. § 119 to Korean Patent Application No. 10-2022-0097518, filed on Aug. 4, 2022, in the Korean Intellectual Property Office, the entire contents of which are hereby incorporated by reference.

FIELD

Some example embodiments of the inventive concepts relate to a substrate loading apparatus, semiconductor manufacturing equipment including the same, and/or a method of manufacturing a semiconductor package using the semiconductor manufacturing equipment, including a substrate loading apparatus including an elevator capable of receiving a plurality of magazines, semiconductor manufacturing equipment including the same, and/or a method of manufacturing a semiconductor package using the semiconductor manufacturing equipment.

BACKGROUND

Semiconductor package may mean an electronic component in which a semiconductor chip is mounted on a substrate such as a printed circuit board (PCB) so as to be usable in an electronic product. The semiconductor package may be manufactured through various processes. For example, the semiconductor package may be manufactured through a bonding process of mounting the semiconductor chip on the substrate, a molding process of forming a molding layer covering the substrate and the semiconductor chip, and a test process of testing performance of the package in which the semiconductor chip is mounted. In each step, the semiconductor package may be moved from a unit process equipment to another unit process equipment. A substrate loading apparatus may be used to provide the semiconductor package into the unit process equipment.

SUMMARY

Some example embodiments of the inventive concepts may provide a substrate loading apparatus capable of providing (or loading) a semiconductor package into unit process equipment and replacing a magazine at the same or substantially the same time when the semiconductor package is loaded, semiconductor manufacturing equipment including the same, and a method of manufacturing a semiconductor package using the semiconductor manufacturing equipment.

In an example embodiment, a substrate loading apparatus includes a pickup apparatus configured to move a magazine in a first direction, a second direction and a third direction, an elevator defining a plurality of waiting spaces, a stage configured to support the magazine, and an insert apparatus configured to transfer substrates in the magazine. At least one of the plurality of waiting spaces of the elevator is configured to selectively receive the magazine, and the pickup apparatus is spaced apart from the elevator and the stage in the third direction.

In an example embodiment, semiconductor manufacturing equipment includes a substrate loading apparatus, and unit process equipment. The substrate loading apparatus includes a pickup apparatus configured to move a magazine in a first direction, a second direction and a third direction, an elevator defining a plurality of waiting spaces, a first stage and a second stage each configured to support the magazine, a distribution port spaced apart from the elevator in the first direction, and an insert apparatus comprising a supply robot configured to move a substrate into the unit process equipment. The pickup apparatus includes a fixing unit configured to fix the magazine, a driving unit configured to vertically move the fixing unit, and an opening and closing unit configured to open and close the magazine.

In an example embodiment, a method of manufacturing a semiconductor package includes preparing a magazine including substrates, transferring the magazine to an elevator using a pickup apparatus, moving the substrates into unit process equipment using an insert apparatus, performing a package process in the unit process equipment, and ejecting the magazine after the performing of the package process, wherein the moving of the substrates into the unit process equipment is performed simultaneously with the transferring of the magazine to the elevator or the ejecting of the magazine.

DETAILED DESCRIPTION

Figure 1:
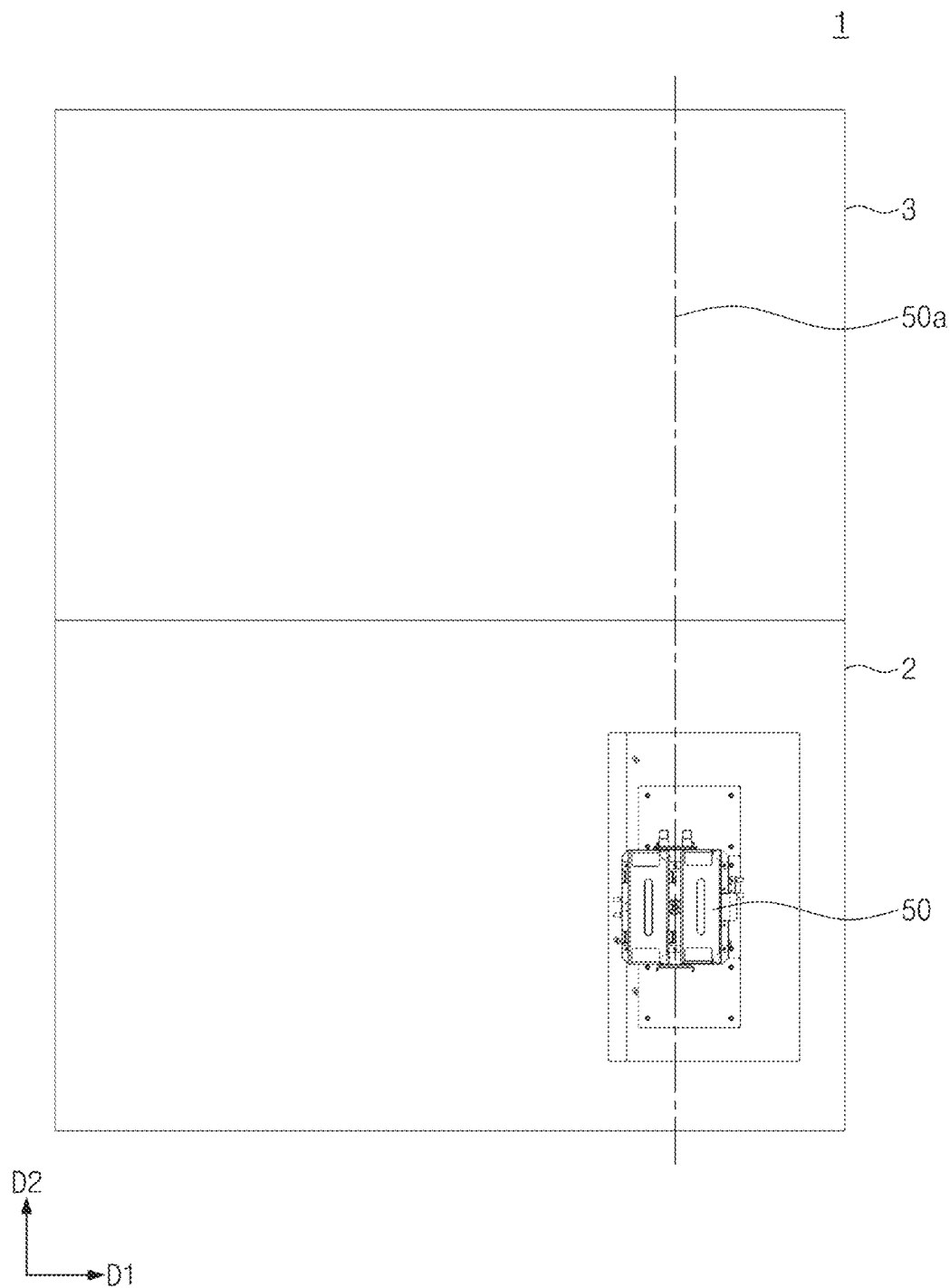
FIG. 1 is a plan view illustrating semiconductor manufacturing equipment according to some example embodiments of the inventive concepts.

Example embodiments of the inventive concepts will now be described more fully with reference to the accompanying drawings. The same reference numerals or the same reference designators may denote the same components or elements throughout the specification.

FIG. 1 is a plan view illustrating semiconductor manufacturing equipment according to some example embodiments of the inventive concepts.

Referring to FIG. 1, semiconductor manufacturing equipment 1 may be provided. For example, the semiconductor manufacturing equipment 1 may be equipment for manufacturing a semiconductor package. The semiconductor manufacturing equipment 1 may include a substrate loading apparatus 2 and unit process equipment 3. The substrate loading apparatus 2 and the unit process equipment 3 may meet each other in a second direction D2. Alternatively, the substrate loading apparatus 2 and the unit process equipment 3 may be spaced apart from each other in the second direction D2.

The substrate loading apparatus 2 may include a distribution port 50. A magazine MZ may be located on the distribution port 50. A distribution apparatus (not shown) may move the magazine MZ to locate the magazine MZ on the distribution port 50. The magazine MZ may be loaded/unloaded into/from the semiconductor manufacturing equipment 1 by the distribution apparatus. A movement path 50a of the distribution apparatus may be located at a higher level than the semiconductor manufacturing equipment 1. In other words, the movement path 50a of the distribution apparatus may be spaced apart from the semiconductor manufacturing equipment 1 in a vertical direction. The movement path 50a of the distribution apparatus may extend in the second direction D2, but example embodiments of the inventive concepts are not limited thereto. The distribution port 50 may be located under the movement path 50a of the distribution apparatus. For example, the distribution port 50 may be an overhead hoist transport (OHT) port or a conveyor port.

Even though not shown in FIG. 1, the magazine MZ may provide slots. The slots may be spaced apart from each other in the vertical direction. Substrates may be located in the slots. Thus, the substrates may be spaced apart from each other in the vertical direction. Each of the substrates may include a printed circuit board (PCB) on which a semiconductor chip is mounted.

The unit process equipment 3 may be configured to perform a semiconductor package process. The semiconductor package process may include a molding process, a marking process, an external terminal attaching process (e.g., a solder ball attaching process), or a sawing process, but example embodiments are not limited thereto.

The molding process may be a process of providing an epoxy molding compound (EMC) onto the substrate on which the semiconductor chip is mounted. The molding process may include a transfer molding process and/or a compression molding process.

The marking process may be a process of marking a manufacturer's logo and a production date onto a semiconductor package to distinguish the semiconductor package from another semiconductor package. For example, the marking process may use ink and/or laser.

The external terminal attaching process may be a process of attaching an external terminal for electrically connecting a semiconductor package to an external electronic device. For example, the external terminal may be a solder ball.

The sawing process may be a process of separating semiconductor packages from each other. For example, the sawing process may include a blade dicing process, a laser dicing process, and/or a plasma dicing process, but example embodiments are not limited thereto.

Figure 2:
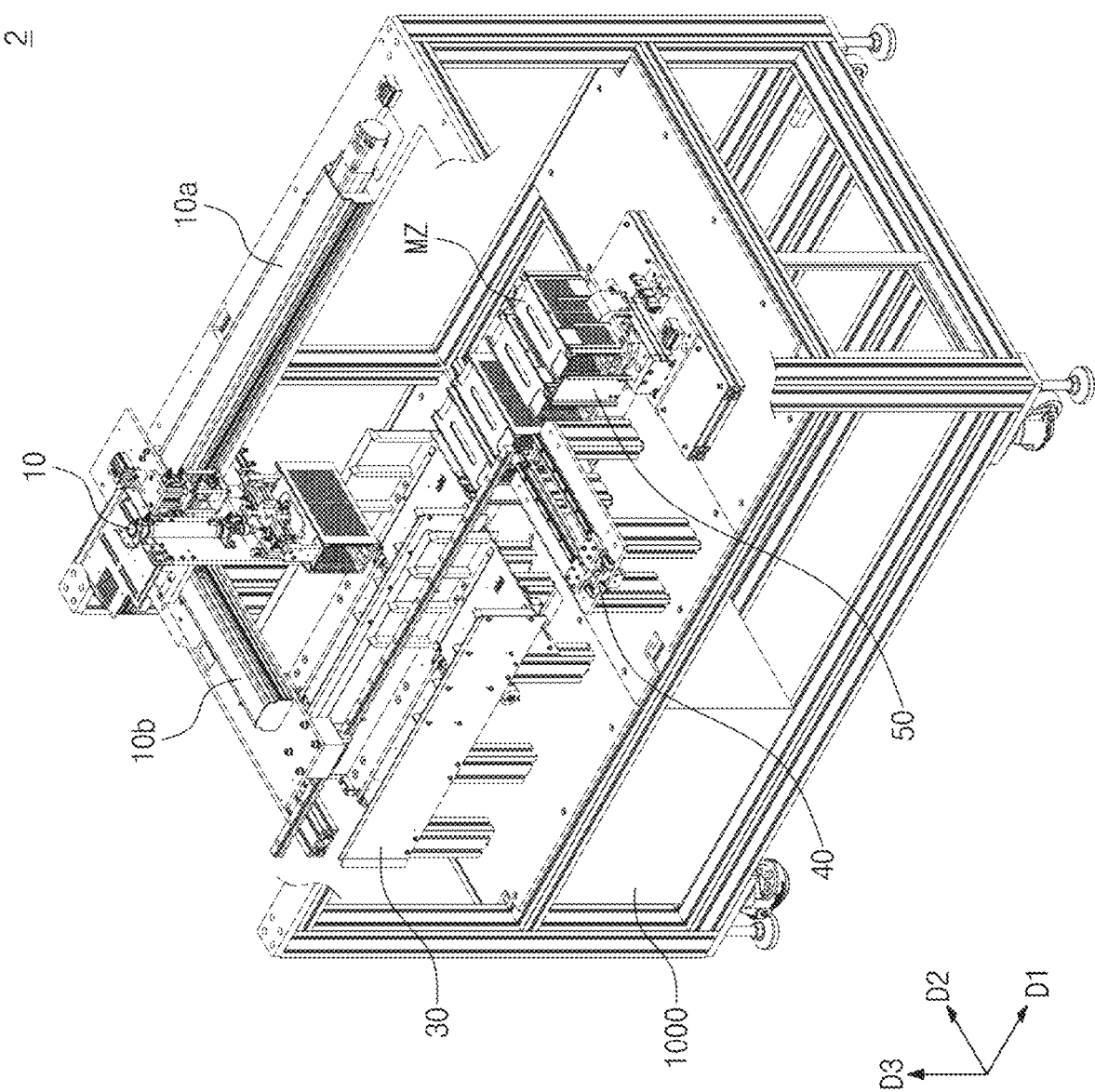
FIGS. 2 to 4 are views illustrating a substrate loading apparatus according to some example embodiments of the inventive concepts.
Figure 3:
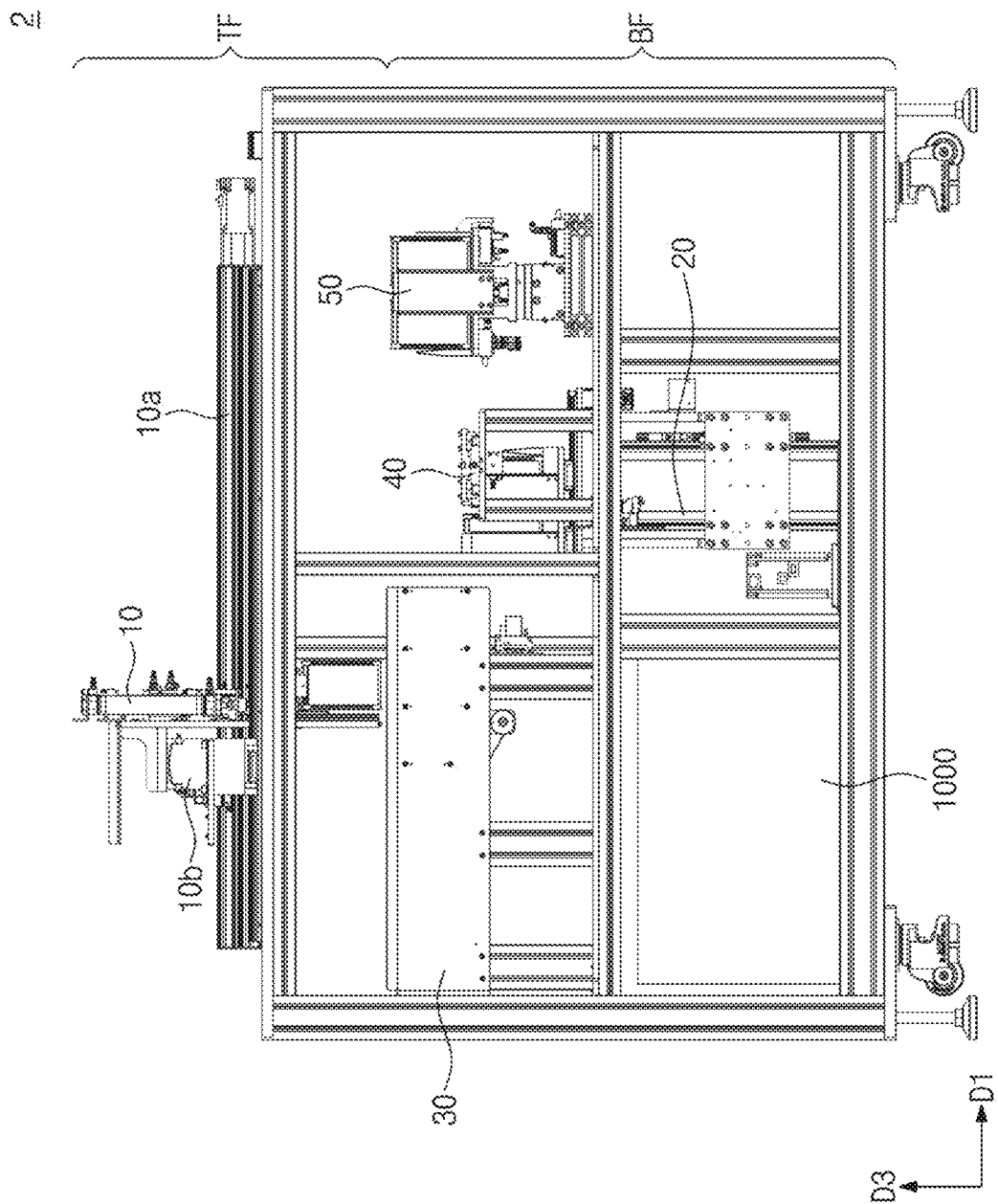
Figure 4:
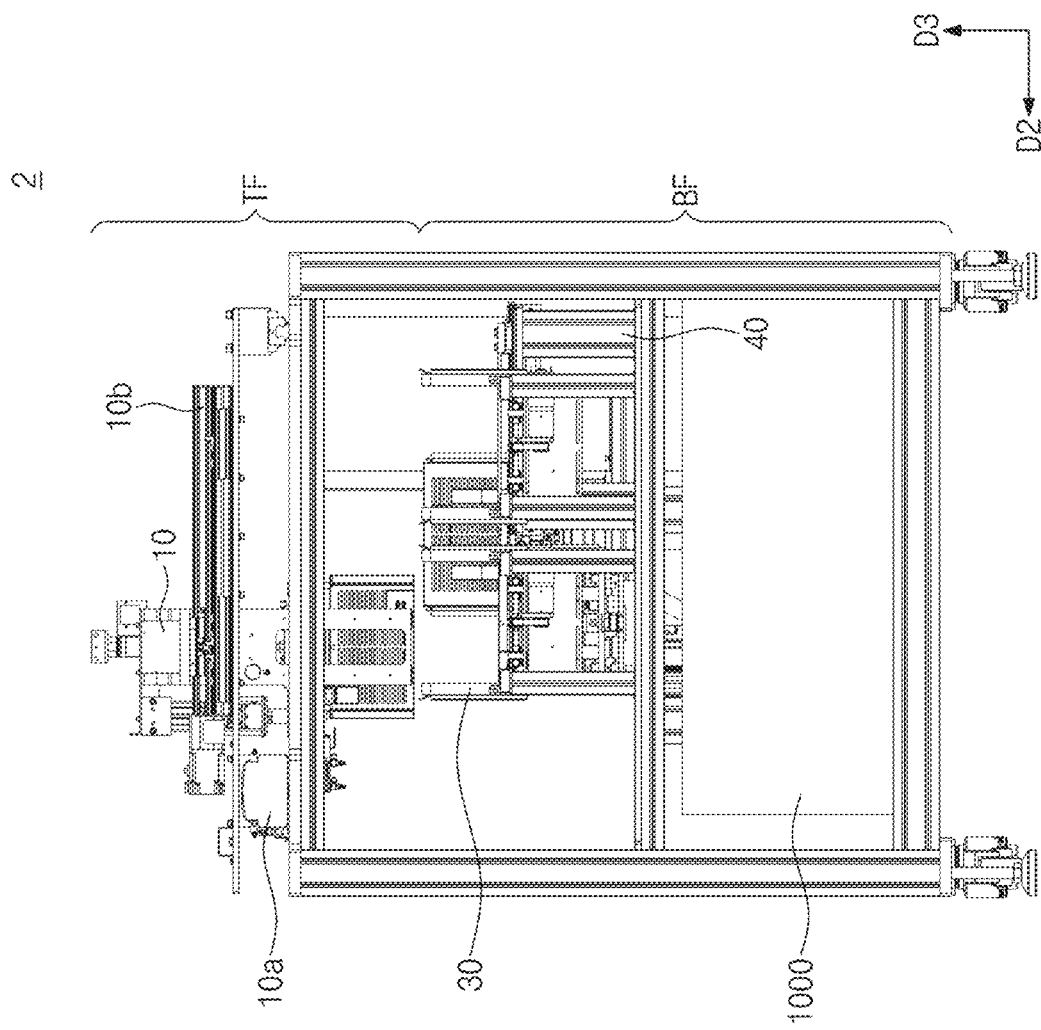

FIGS. 2 to 4 are views illustrating a substrate loading apparatus according to some example embodiments of the inventive concepts.

Referring to FIGS. 2 to 4, the substrate loading apparatus 2 may be provided. The substrate loading apparatus 2 may include an upper apparatus TF and a lower apparatus BF. The upper apparatus TF may be provided on the lower apparatus BF. The upper apparatus TF may include a pickup apparatus 10. The lower apparatus BF may include an elevator 20, a stage 30, an insert apparatus 40, the distribution port 50, and a control box 1000.

The pickup apparatus 10 may be configured to move in a first direction D1 and the second direction D2. The magazine MZ may be moved by the pickup apparatus 10. More particularly, the pickup apparatus 10 may move the magazine MZ from the distribution port 50 to the stage 30 and the elevator 20. On the other hand, the pickup apparatus 10 may move the magazine MZ from the elevator 20 and the stage 30 to the distribution port 50 again. In addition, the pickup apparatus 10 may move the magazine MZ from the elevator 20 to the stage 30 or from the stage 30 to the elevator 20.

The pickup apparatus 10 may be included in the upper apparatus TF and thus may be spaced apart from the elevator 20, the stage 30, the insert apparatus 40, the distribution port 50 and the control box 1000 included in the lower apparatus BF in a third direction D3. In other words, the pickup apparatus 10 may be located on the distribution port 50, the elevator 20 and the stage 30.

The elevator 20 may be located in a central portion of the substrate loading apparatus 2. The elevator 20 may be located between the stage 30 and the distribution port 50. The elevator 20 may overlap with the insert apparatus 40 in the second direction D2.

A plurality of the magazines MZ may be located on the elevator 20. Thus, while the semiconductor package process of one of the magazines MZ is performed, another empty magazine MZ in which the semiconductor package process is completed may be replaced with a new magazine MZ by the pickup apparatus 10. In other words, the semiconductor package process and the replacement of the magazine MZ may be performed at the same or substantially the same time. As a result, the semiconductor package process may be continuously performed regardless of the replacement of the magazine MZ, and thus productivity of a semiconductor package may be improved.

The stage 30 may be located in a side portion of the substrate loading apparatus 2. The stage 30 may have a shape extending in the first direction D1. A plurality of the magazines MZ may be located in the stage 30. The magazines MZ may wait in the stage 30 before or after the substrates are supplied into the unit process equipment 3. In other words, the stage 30 may perform a buffer function of temporarily waiting the magazines MZ.

The insert apparatus 40 may be located in a central portion of the substrate loading apparatus 2 and may be located between the stage 30 and the distribution port 50. The insert apparatus 40 may include a supply robot (not shown). The supply robot may have a bar shape, but example embodiments of the inventive concepts are not limited thereto.

The supply robot may be configured to supply the substrates located in the magazine MZ into the unit process equipment 3. More particularly, the supply robot may be movable in the second direction D2. The supply robot may come in contact with a side surface of the substrate in the magazine MZ. The supply robot may come in contact with the substrate to push the substrate in the second direction D2. The substrate may move in the second direction D2 to move into the unit process equipment 3.

The control box 1000 may include a controller capable of controlling the pickup apparatus 10, the elevator 20, the stage 30, the insert apparatus 40 and the distribution port 50. The control box 1000 may be configured to provide information (or data) on a position and a state of the magazine MZ to a user. The control box 1000 may be configured to exchange electric communication with the distribution apparatus. The controller may include a plurality of personal computers (PC).

Figure 5:
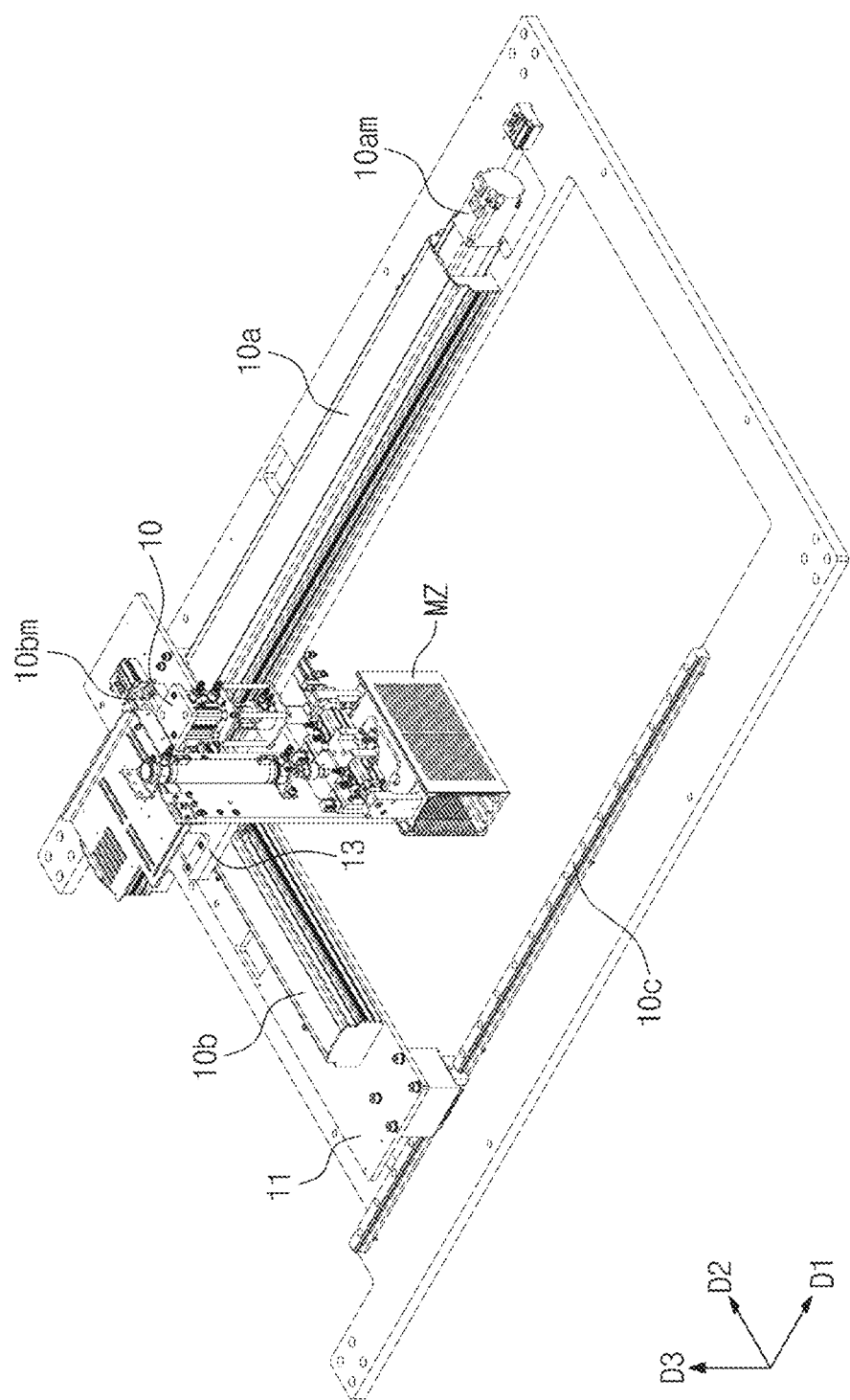
FIGS. 5 to 7 are views illustrating an upper apparatus of a substrate loading apparatus according to some example embodiments of the inventive concepts.
Figure 6:
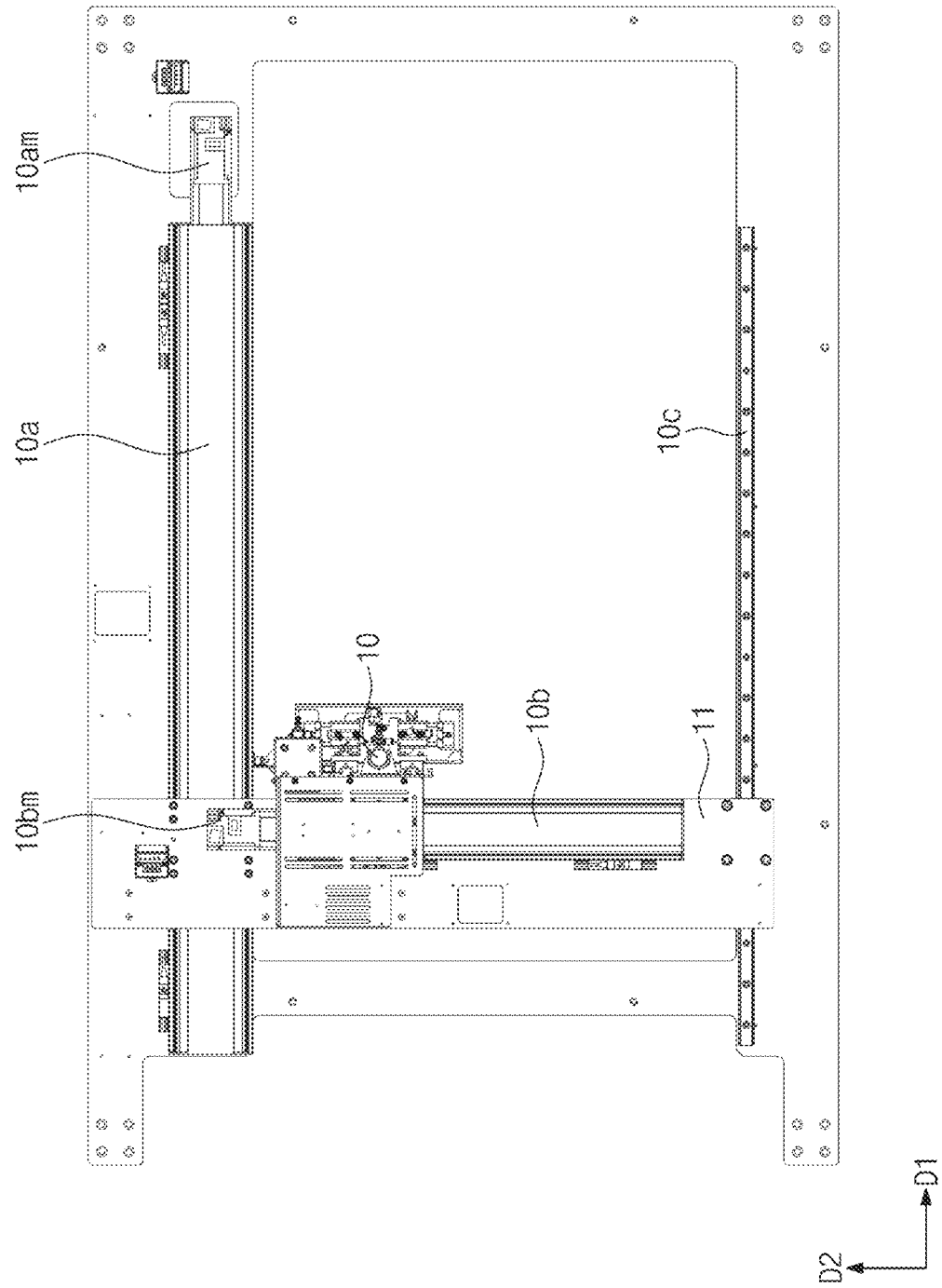
Figure 7:
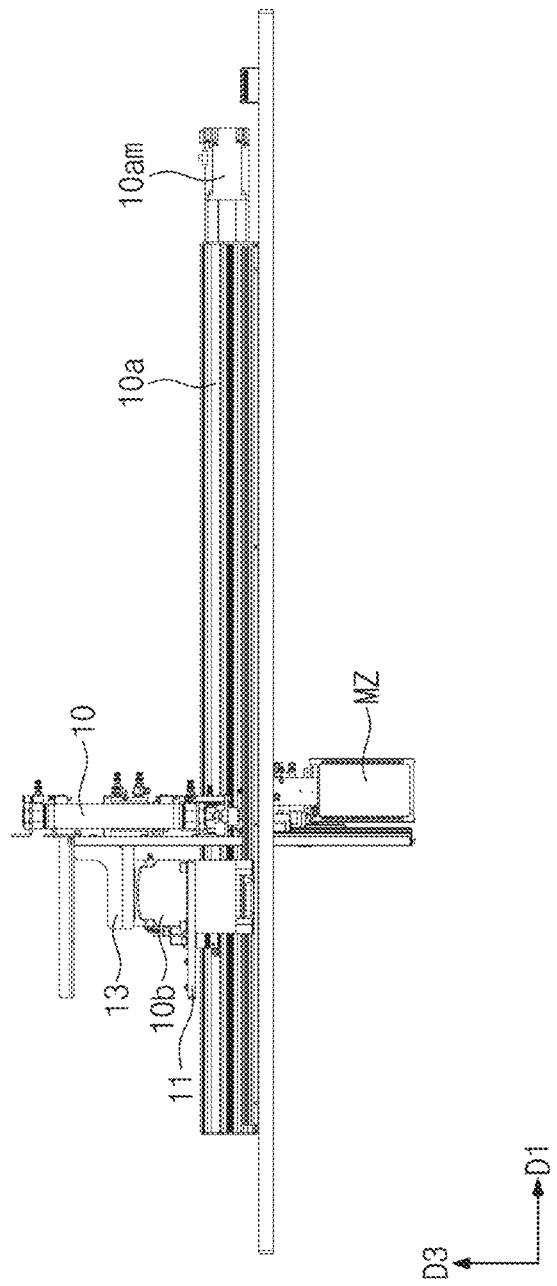
Figure 8:
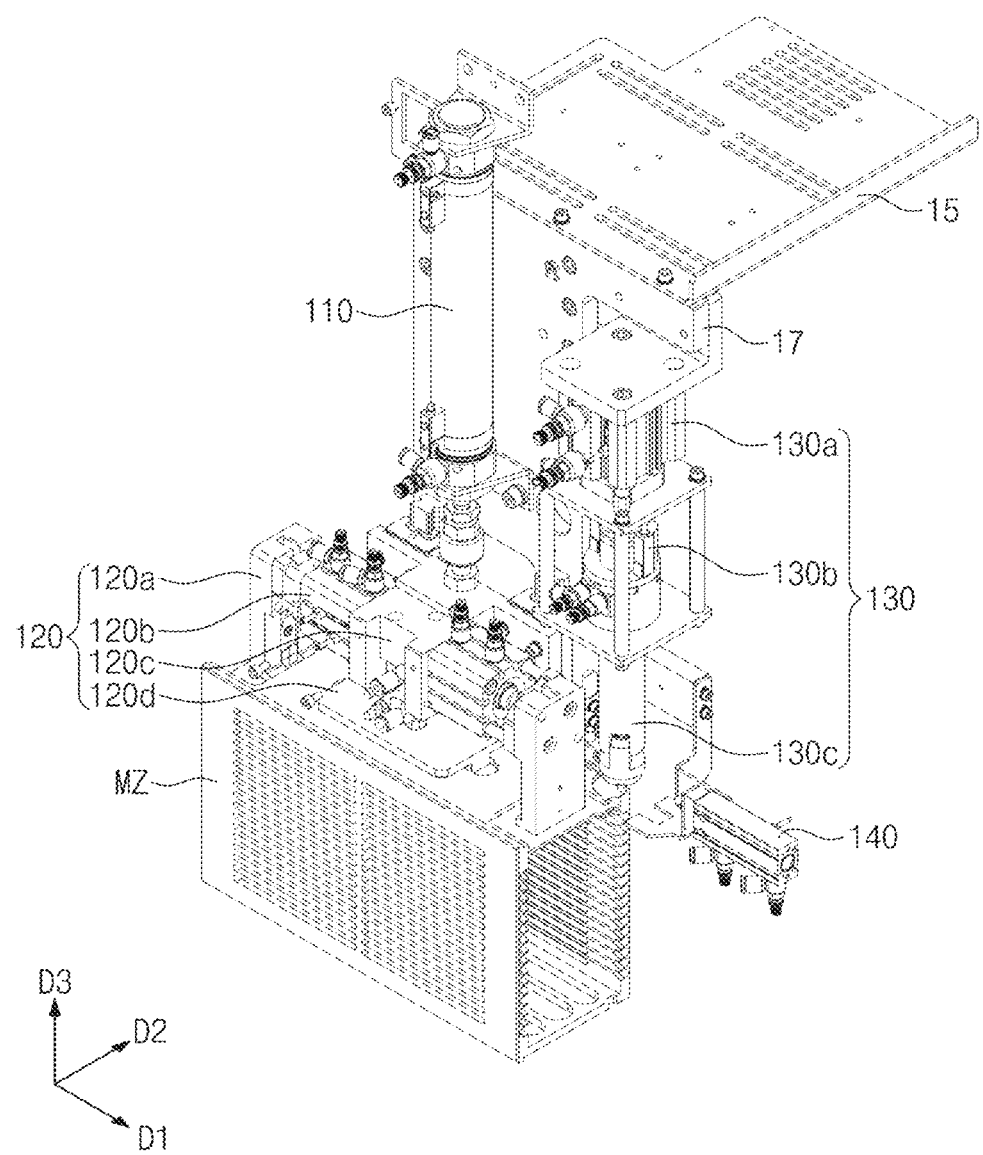
FIGS. 8 to 11 are views illustrating a pickup apparatus of a substrate loading apparatus according to some example embodiments of the inventive concepts.
Figure 9:
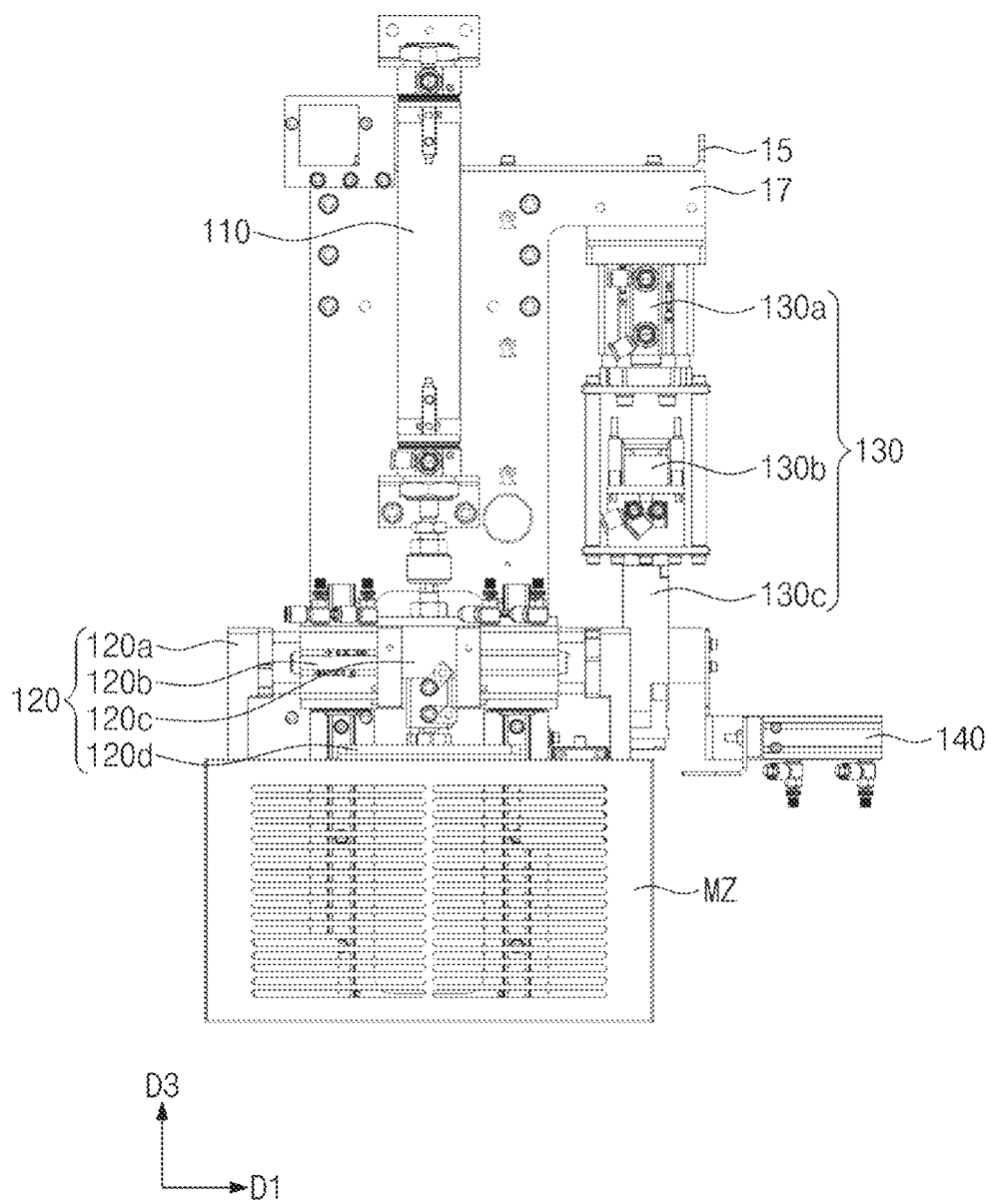
Figure 10:
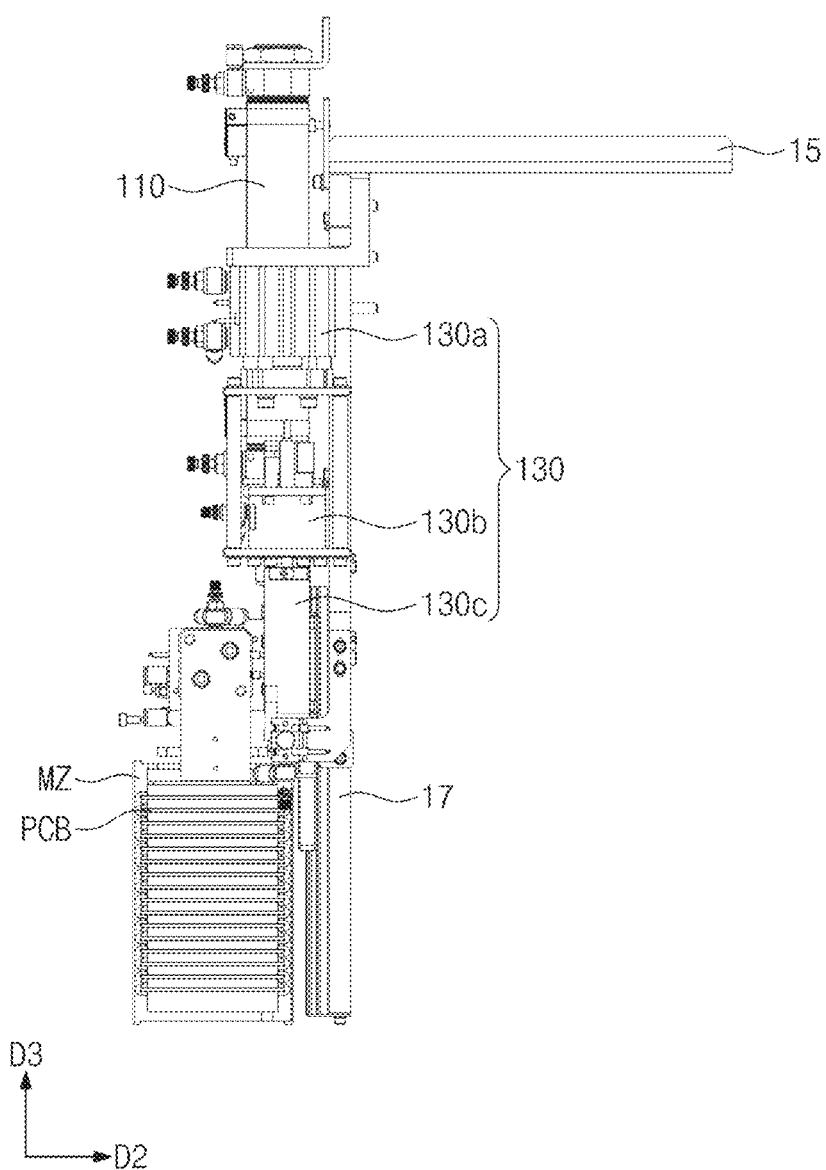
Figure 11:
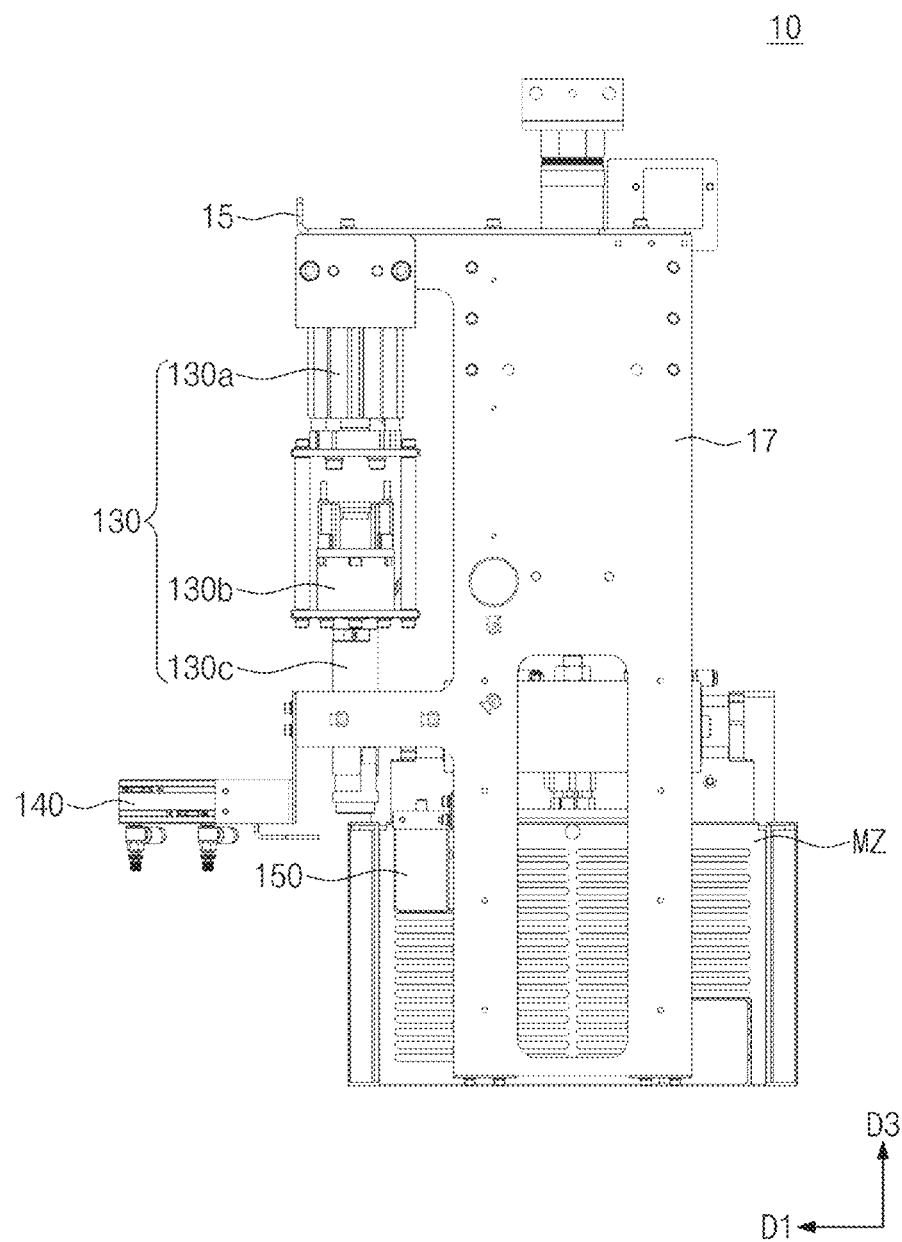

FIGS. 5 to 7 are views illustrating an upper apparatus of a substrate loading apparatus according to some example embodiments of the inventive concepts.

Hereinafter, for the purpose of ease and convenience in explanation, the descriptions to the same features as mentioned with reference to FIGS. 1 to 4 will be omitted and differences will be mainly described.

Referring to FIGS. 5 to 7, the upper apparatus TF may include a first rail 10*a*, a second rail 10*b*, and an auxiliary rail 10*c*. The first rail 10*a* may have a shape extending in the first direction D1. The second rail 10*b* may have a shape extending in the second direction D2. The first rail 10*a* may be perpendicular or substantially perpendicular to the second rail 10*b* when viewed in a plan view. The auxiliary rail 10*c* may have a shape extending in the first direction D1. In other words, the auxiliary rail 10*c* may be parallel or substantially parallel to the first rail 10*a* and may be spaced apart from the first rail 10*a* in the second direction D2. The first rail 10*a* may include a first motor 10*am*. The second rail 10*b* may include a second motor 10*bm*. The auxiliary rail 10*c* may not include a separate motor. For example, each of the first and second motors 10*am* and 10*bm* may be a linear motor.

In a vertical view, a first supporter 11 may be located on the first rail 10*a* and the auxiliary rail 10*c*. The second rail 10*b* may be located on the first supporter 11. A second supporter 13 may be located on the second rail 10*b*.

The first supporter 11 may be connected to the first rail 10*a* and the auxiliary rail 10*c*. The first supporter 11 may have a shape extending in the second direction D2. The first supporter 11 may be movable in the first direction D1 by the first motor 10*am* of the first rail 10*a*.

The second rail 10*b* may be fixed on the first supporter 11. The second supporter 13 may be connected to the second rail 10*b*. The second supporter 13 may be movable in the second direction D2 by the second motor 10*bm*. The second supporter 13 may connect the pickup apparatus 10 to the second rail 10*b*. A length of the second rail 10*b* in the second direction D2 may be substantially equal to or less than a length of the first supporter 11 in the second direction D2. The second supporter 13 may be movable between the first rail 10*a* and the auxiliary rail 10*c*.

The pickup apparatus 10 may be connected to the second rail 10*b* by the second supporter 13, and the second rail 10*b* may be connected to the first rail 10*a* and the auxiliary rail 10*c* by the first supporter 11. In other words, the pickup apparatus 10 may be connected to the first and second rails 10*a* and 10*b*. Thus, the pickup apparatus 10 may be movable in the first direction D1 by the first rail 10*a* and may be movable in the second direction D2 by the second rail 10*b*.

The pickup apparatus 10 may be movable onto first and second regions R1 and R2 of the stage 30 to be described later but may not be movable onto a third region R3 of the stage 30. The third region R3 of the stage 30 may not overlap with the pickup apparatus 10 when viewed in a plan view. An operator and the pickup apparatus 10 may be spaced apart from each other, and thus the operator may be safe from the pickup apparatus 10.

FIGS. 8 to 11 are views illustrating a pickup apparatus of a substrate loading apparatus according to some example embodiments of the inventive concepts.

Hereinafter, for the purpose of ease and convenience in explanation, the descriptions to the same features as mentioned with reference to FIGS. 1 to 4 will be omitted and differences will be mainly described.

Referring to FIGS. 8 to 11, the pickup apparatus 10 may include a horizontal plate 15 and a vertical plate 17. In addition, the pickup apparatus 10 may include a driving unit 110, a fixing unit 120, an opening/closing unit 130, a check unit 140 and a sensor unit 150, which are located on a side surface of the vertical plate 17.

The vertical plate 17 may be located at a side surface of the horizontal plate 15. The horizontal plate 15 may be located on the vertical plate 17. The horizontal plate 15 and the vertical plate 17 may be coupled to each other by a screw. A portion of the vertical plate 17 may be coupled and fixed to the second supporter 13 of FIG. 5. Alternatively, the horizontal plate 15 and the vertical plate 17 may be coupled to each other in a single body.

The driving unit 110 may be located on the side surface of the vertical plate 17. The driving unit 110 may be coupled to the vertical plate 17. The driving unit 110 may have a shape extending in the third direction D3, but example embodiments of the inventive concepts are not limited thereto. The driving unit 110 may be coupled to the fixing unit 120 to be described later and may be configured to move the fixing unit 120 in parallel to the third direction D3. In other words, the driving unit 110 may be configured to raise or lower the magazine MZ located on the distribution port 50, the elevator 20 and the stage 30 in parallel to the third direction D3. Thus, the magazine MZ fixed to the pickup apparatus 10 may be movable in the first to third directions D1, D2 and D3 by the first and second rails 10*a* and 10*b* of FIG. 5 and the driving unit 110.

The driving unit 110 may include a hydraulic cylinder, a pneumatic cylinder, a brushless DC (BLDC) motor, a stepping motor, and/or a linear motor, but example embodiments are not limited thereto.

The fixing unit 120 may be located on the side surface of the vertical plate 17. The fixing unit 120 may include a grip part 120*a*, a driving part 120*b*, a support part 120*c*, and a fixing part 120*d*. A pair of the driving parts 120*b*, the support part 120*c* and the fixing part 120*d* may be located between a pair of the grip parts 120*a*. The support part 120*c* may be located between the pair of driving parts 120*b*. The fixing part 120*d* may be located under the support part 120*c*. The support part 120*c* may be coupled to a lower portion of the driving unit 110.

A width of the grip part 120*a* in the second direction D2 may be less than a width of the magazine MZ in the second direction D2. The grip part 120*a* may be movable in the first direction D1 by the driving part 120*b*. A lower portion of the grip part 120*a* may be coupled to an upper portion of the magazine MZ. In other words, the pair of grip parts 120*a* may be coupled to upper portions of both sides of the magazine MZ. Thus, when the pickup apparatus 10 raises or transfers the magazine MZ, the magazine MZ may be fixed by the grip part 120*a* and the driving part 120*b*. The magazine MZ may not be moved in the first direction D1 by the grip part 120*a*.

The driving part 120*b* may be coupled to an upper portion of the grip part 120*a*. The driving part 120*b* may be located between the grip part 120*a* and the support part 120*c*. The driving part 120*b* may be movable in the first direction D1. The driving part 120*b* may include a pneumatic cylinder and/or a hydraulic cylinder.

The fixing part 120*d* may include a plate and a block protruding from the plate. The block may be coupled into a recess located in an upper portion of the magazine MZ. A width, in the second direction D2, of the block of the fixing part 120*d* may be substantially equal to a width, in the second direction D2, of the recess located in the upper portion of the magazine MZ. When the block of the fixing part 120*d* is coupled into the recess of the magazine MZ, the block and the magazine MZ may not be spaced apart from each other in the second direction D2. Thus, the magazine MZ may be fixed in the second direction D2.

The magazine MZ may be fixed in the first direction D1 by the grip part 120*a* and the driving part 120*b* and may be fixed in the second direction D2 by the fixing part 120*d*. The pickup apparatus 10 may fix the magazine MZ in the first and second directions D1 and D2 and thus may transfer the magazine MZ to an exact position.

The opening/closing unit 130 may be spaced apart from the driving unit 110 in the first direction D1 and may be located or placed on the side surface of the vertical plate 17. The opening/closing unit 130 may be coupled to the vertical plate 17. The opening/closing unit 130 may include a vertical driving part 130*a*, a rotation driving part 130*b*, and an opener 130*c*. The opener 130*c*, the rotation driving part 130*b* and the vertical driving part 130*a* may be located in order from bottom to top. In other words, the rotation driving part 130*b* may be located between the opener 130*c* and the vertical driving part 130*a*. The vertical driving part 130*a*, the rotation driving part 130*b* and the opener 130*c* may be coupled to each other by screws.

The rotation driving part 130*b* and the opener 130*c* may be movable in the third direction D3 by the vertical driving part 130*a*. The opener 130*c* may be rotatable on a plane defined by the first and second directions D1 and D2 by the rotation driving part 130*b*. In other words, the opener 130*c* may be movable in the third direction D3 by the vertical driving part 130*a* and may be rotatable by the rotation driving part 130*b*.

A recess may be provided in a lower portion of the opener 130*c*, and a stopper of the magazine MZ may be opened or closed by the recess. More particularly, the opener 130*c* may be moved in the third direction D3 by the vertical driving part 130*a* of the opening/closing unit 130, and thus the stopper of the magazine MZ may be coupled to or engaged with the recess of the opener 130*c*. Thereafter, the opener 130*c* may be rotated by the rotation driving part 130*b* to open or close the stopper of the magazine MZ. Next, the opener 130*c* may be moved again in the third direction D3 by the vertical driving part 130*a*.

The vertical driving part 130*a* may include a hydraulic cylinder, a pneumatic cylinder, and/or a linear motor. The rotation driving part 130*b* may include a brushless DC (BLDC) motor, a stepping motor, and/or a spinner motor, but example embodiments are not limited thereto.

The check unit 140 may be spaced apart from the vertical plate 17 in the first direction D1. The check unit 140 may be movable in the first direction D1. The check unit 140 may include a guide part, and the guide part may be located at a side surface of the check unit 140, which is adjacent to the magazine MZ. The guide part of the check unit 140 may check whether the stopper of the magazine MZ is opened or not.

The sensor unit 150 may be located between the vertical plate 17 and the magazine MZ. The sensor unit 150 may be located at the same or substantially the same level as a tag located at a side surface of the magazine MZ. In some example embodiments, the sensor unit 150 may identify the tag of the magazine MZ. The sensor unit 150 may transmit information (or data) on the magazine to the control box 1000 of FIG. 2. For example, the tag of the magazine MZ may be a radio frequency identification (RFID). In some example embodiments, the sensor unit 150 may identify the information (or data) of the magazine MZ using a frequency.

Figure 12:
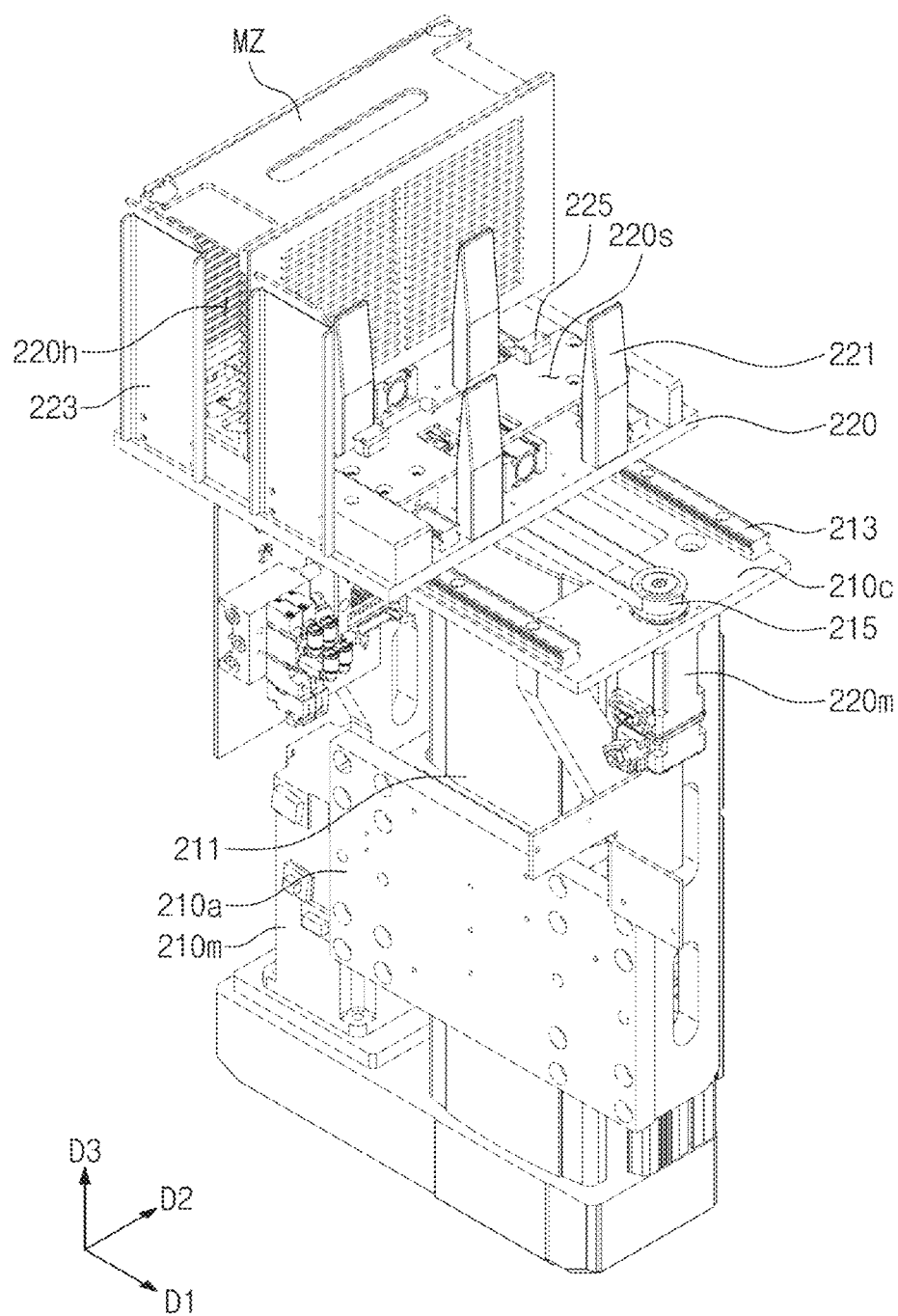
FIGS. 12 to 14 are views illustrating an elevator of a substrate loading apparatus according to some example embodiments of the inventive concepts.
Figure 13:
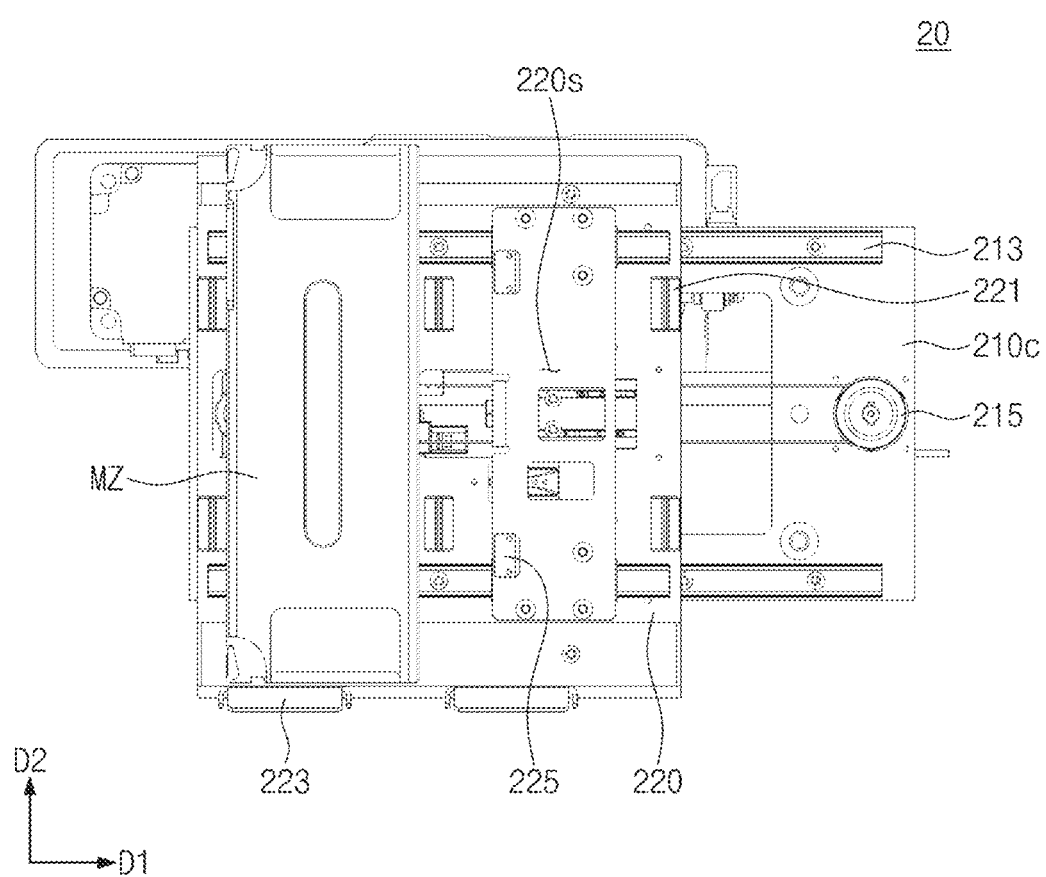
Figure 14:
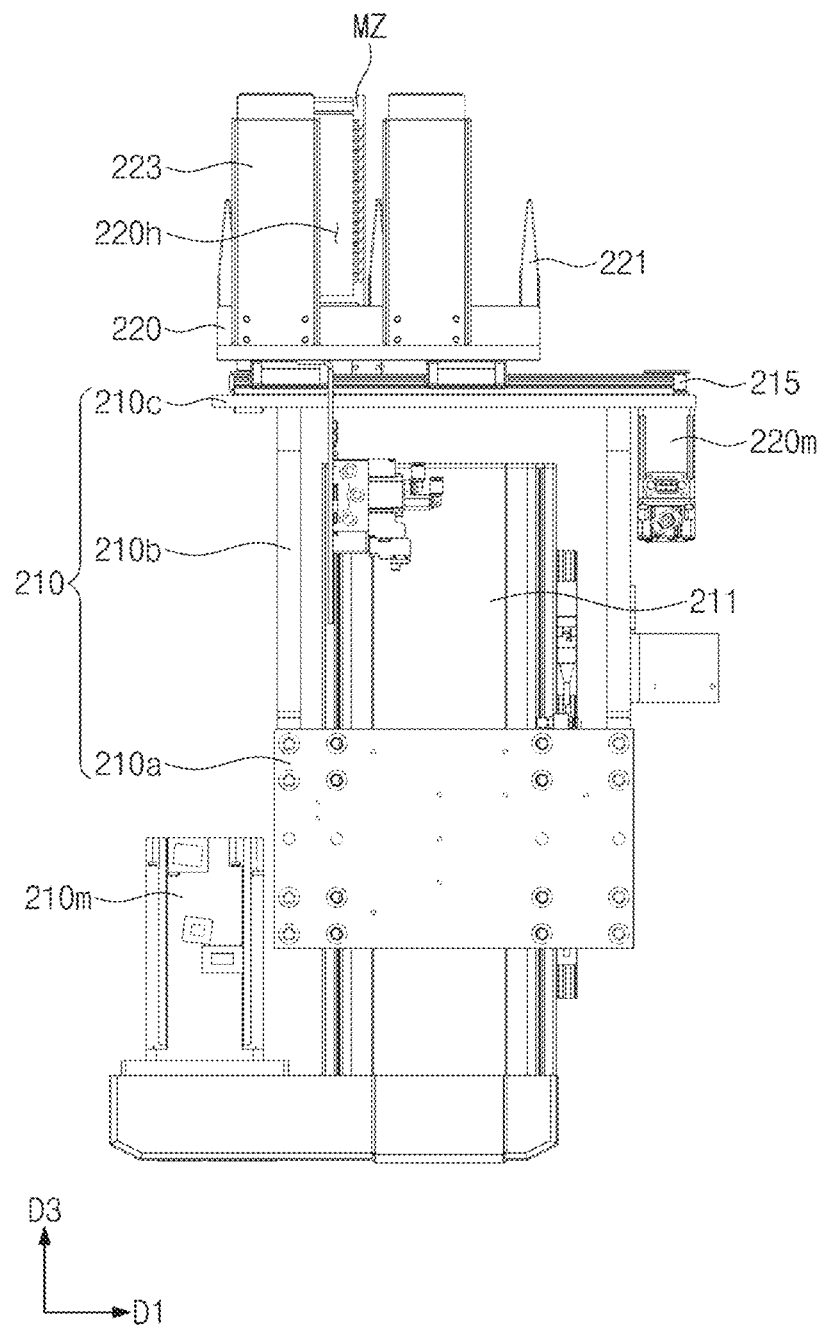

FIGS. 12 to 14 are views illustrating an elevator of a substrate loading apparatus according to some example embodiments of the inventive concepts.

Hereinafter, for the purpose of ease and convenience in explanation, the descriptions to the same features as mentioned with reference to FIGS. 1 to 4 will be omitted and differences will be mainly described.

Referring to FIGS. 12 to 14, the elevator 20 may include a lower plate 210 and an upper plate 220. The lower plate 210 may include a first portion 210*a*, a second portion 210*b*, and a third portion 210*c*. The second portion 210*b* of the lower plate 210 may connect the first and third portions 210*a* and 210*c* of the lower plate 210. The first to third portions 210*a*, 210*b* and 210*c* of the lower plate 210 may be coupled to each other by screws. Alternatively, the first to third portions 210*a*, 210*b* and 210*c* of the lower plate 210 may constitute a single body.

The first portion 210*a* of the lower plate 210 may be connected to a vertical rail 211. A third motor 210*m* may be spaced apart from the vertical rail 211 in the first direction D1, but example embodiments of the inventive concepts are not limited thereto. The third motor 210*m* may be configured to move the lower plate 210 along the vertical rail 211 in the third direction D3. For example, the third motor 210*m* may be a linear motor.

The third portion 210*c* of the lower plate 210 may be located at a higher level than a top surface of the vertical rail 211. In other words, the third portion 210*c* of the lower plate 210 may be spaced apart from the vertical rail 211 in the third direction D3. Plate rails 213, a plate belt 215 and the upper plate 220 may be provided on the third portion 210*c* of the lower plate 210. A fourth motor 220*m* may be provided under the third portion 210*c* of the lower plate 210.

The plate rails 213 may be located on both end portions of the third portion 210*c* of the lower plate 210. The plate rails 213 may extend in the first direction D1 and may be spaced apart from each other in the second direction D2. A length, in the first direction D1, of each of the plate rails 213 may be substantially equal to or less than a length, in the first direction D1, of the third portion 210*c* of the lower plate 210.

The plate belt 215 may be located on a central portion of the third portion 210*c* of the lower plate 210. In other words, the plate belt 215 may be located between the plate rails 213. The plate belt 215 may be located at the same or substantially the same level as the plate rails 213. A length of the plate belt 215 in the first direction D1 may be substantially equal to or less than the length of the plate rails 213 in the first direction D1. The plate belt 215 may be movable by the fourth motor 220*m*. The plate belt 215 may be connected to a lower portion of the upper plate 220. Thus, the upper plate 220 may be movable on the plate rails 213 in the first direction D1.

Since the upper plate 220 is located on the lower plate 210, the upper plate 220 may be movable in the third direction D3 by the third motor 210*m* connected to the lower plate 210. The upper plate 220 may be movable in the first and third directions D1 and D3 by the third and fourth motors 210*m* and 220*m*. Thus, the magazine MZ on the upper plate 220, on which the semiconductor package process will be performed, may be moved in the first and third directions D1 and D3 so as to be selected.

The fourth motor 220*m* may include a servo motor, a brushless DC (BLDC) motor, and/or a stepping motor, but example embodiments are not limited thereto.

The upper plate 220 may include first and second guides 221 and 223 and a clamp 225. The first and second guides 221 and 223 may have shapes protruding from a top surface of the upper plate 220 in the third direction D3. The first guides 221 may be spaced apart from each other in the first and second directions D1 and D2. The magazine MZ may be located between the first guides 221 spaced apart from each other in the first direction D1. In other words, a plurality of waiting spaces 220s may be defined by the first guides 221 spaced apart from each other in the first direction D1. Two waiting spaces 220s are illustrated in FIGS. 12 to 14, but example embodiments of the inventive concepts are not limited thereto.

The clamp 225 may be provided between the first guides 221. The clamp 225 may fix the magazine MZ after the magazine MZ is located in the waiting space 220s. The magazine MZ may be fixed to the upper plate 220s by the clamp 225.

The second guides 223 may be spaced apart from each other in the first direction D1. The second guides 223 may be located at a side surface of the upper plate 220s. More particularly, the second guides 223 may be located at the side surface of the upper plate 220s, which is not adjacent to the unit process equipment 3 of FIG. 1. The second guides 223 may block a portion of a surface of the magazine MZ. Thus, semiconductor packages located in the magazine MZ may not move in a direction opposite to the unit process equipment 3 of FIG. 1.

A width of the second guides 223 in the first direction D1 may be less than a width of the magazine MZ in the first direction D1. Thus, a guide hole 220h may be provided between the second guides 223 and the magazine MZ. The supply robot of the insert apparatus 40 of FIG. 2 may be movable through the guide hole 220h in the second direction D2. The supply robot of the insert apparatus 40 may come in contact with semiconductor packages through the guide hole 220h. The guide hole 220h may be provided at a side surface of the magazine MZ, but example embodiments of the inventive concepts are not limited thereto.

Figure 15:
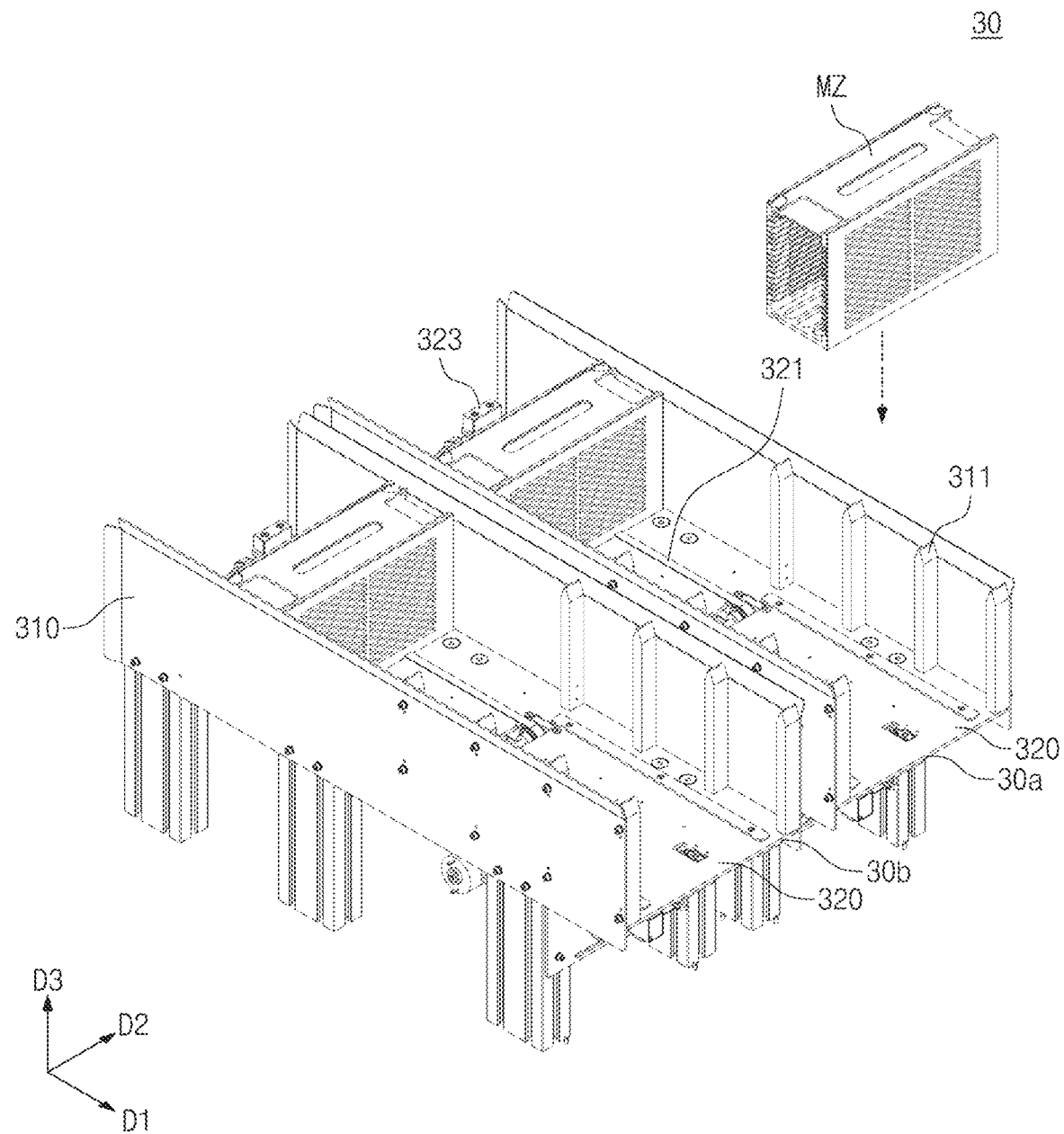
FIGS. 15 to 17 are views illustrating a stage of a substrate loading apparatus according to some example embodiments of the inventive concepts.
Figure 16:
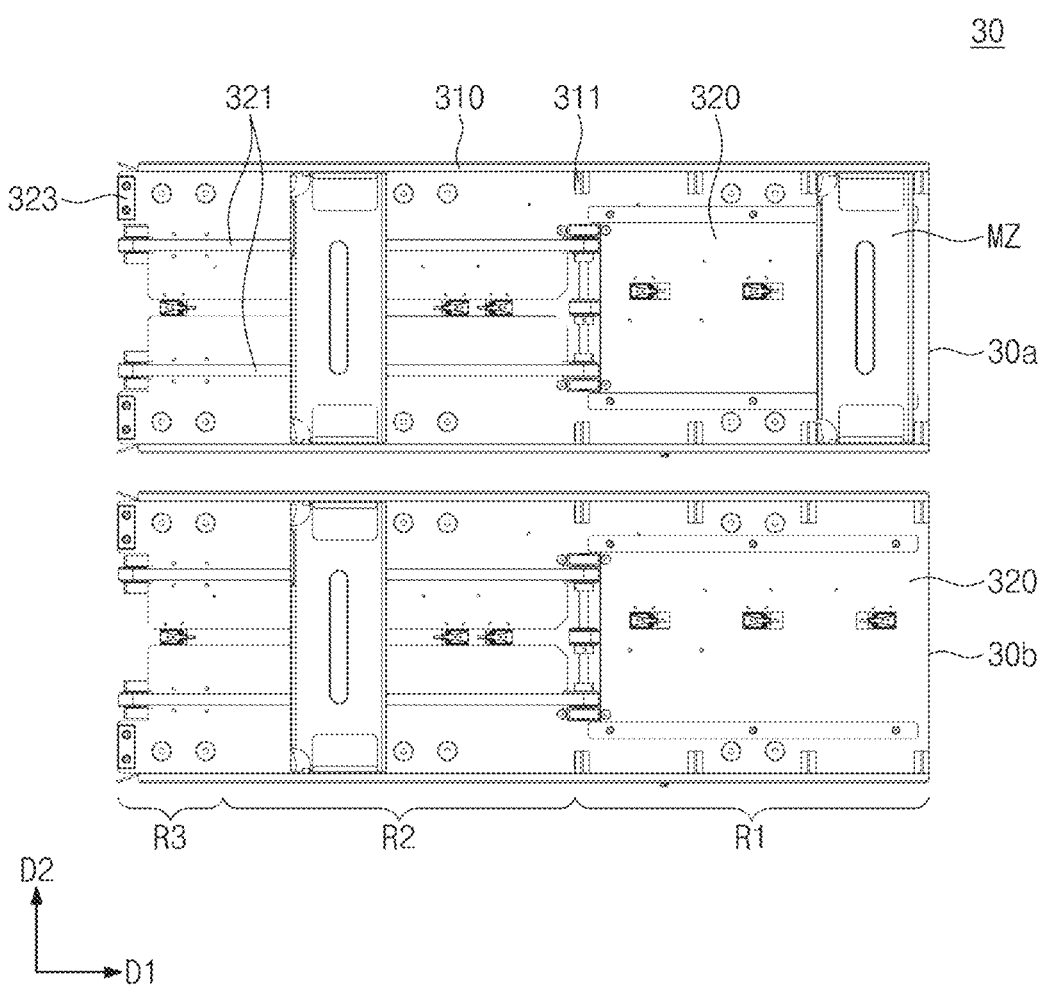
Figure 17:
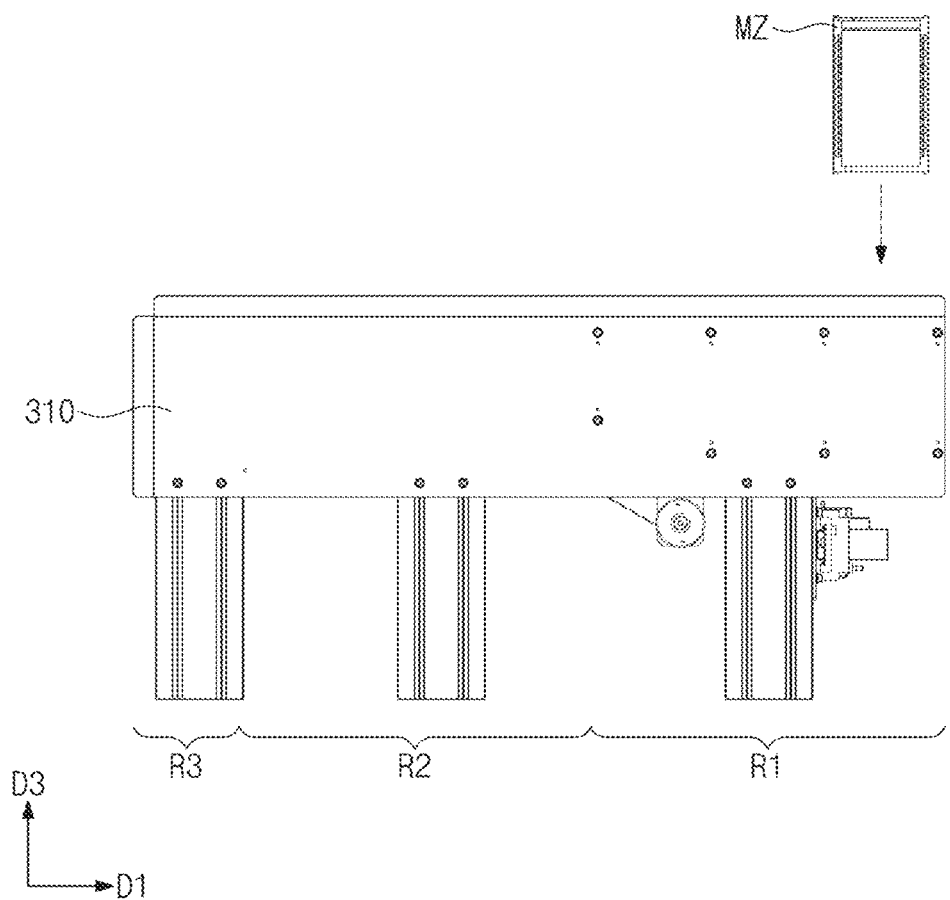

FIGS. 15 to 17 are views illustrating a stage of a substrate loading apparatus according to some example embodiments of the inventive concepts.

Hereinafter, for the purpose of ease and convenience in explanation, the descriptions to the same features as mentioned with reference to FIGS. 2 to 4 will be omitted and differences will be mainly described.

Referring to FIGS. 15 to 17, the stage 30 may include a first stage 30a and a second stage 30b. The first and second stages 30a and 30b may extend in the first direction D1 and may be spaced apart from each other in the second direction D2. Each of the first and second stages 30a and 30b may include a bottom surface 320 and sidewalls 310 protruding from both sides of the bottom surface 320.

For example, the magazine MZ before performing the semiconductor package process may be located in the first stage 30a. The magazine MZ after performing the semiconductor package process may be located in the second stage 30b. In other words, the magazine MZ located in the first stage 30a may include substrates. The magazine MZ located in the second stage 30b may be an empty magazine MZ not including substrates.

The stage 30 may include a first region R1, a second region R2 and a third region R3 which are arranged in the first direction D1. The second region R2 may be located between the first and third regions R1 and R3.

The sidewalls 310 of the stage 30 may include magazine guides 311 on the first region R1. The magazine guides 311 may be spaced apart from each other in the first direction D1. A distance between the magazine guides 311 spaced apart from each other in the first direction D1 may be substantially equal to or greater than the width of the magazine MZ in the first direction D1. Thus, the magazine MZ may be located between the magazine guides 311.

The magazine guides 311 may have shapes protruding from the bottom surface 320 of the stage 30 in the third direction D3. A width of an upper portion of each of the magazine guides 311 may be less than a width of a lower portion of each of the magazine guides 311. In other words, the upper portion of each of the magazine guides 311 may have a tapered shape. Thus, when the magazine MZ is placed by the pickup apparatus 10 in the third direction D3, the magazine MZ may not collide with the magazine guides 311 and may be aligned on the first region R1 of the stage 30.

The bottom surface 320 of the stage 30 may further include a conveyor belt 321 on the second and third regions R2 and R3. The conveyor belt 321 may have a shape extending in the first direction D1. The conveyor belt 321 may be located at a central portion of the bottom surface 320 of the stage 30. The conveyor belt 321 may include a conveyor motor. The conveyor motor may be located under the bottom surface 320 of the stage 30. The magazine MZ located on the second and third regions R2 and R3 of the stage 30 may be movable in the first direction D1 by the conveyor belt 321.

The bottom surface 320 of the stage 30 may further include a bump 323. The bump 323 may be located on the third region R3 of the stage 30. The bump 323 may have a shape protruding from the bottom surface 320 in the third direction D3. The magazine MZ moving in the first direction D1 may be stopped by the bump 323.

For example, the third region R3 of the stage 30 may be a work region. An operator may be positioned at a side of the stage 30, which is adjacent to the third region R3. The operator may manually provide/eject the magazine MZ onto/from the third region R3.

More particularly, the operator may provide the magazine MZ onto the third region R3 of the first stage 30a. The conveyor belt 321 of the first stage 30a may move the magazine MZ from the third region R3 to the second region R2. Thereafter, the magazine MZ may be transferred to the elevator 20 by the pickup apparatus 10.

The pickup apparatus 10 may transfer an empty magazine MZ from the elevator 20 to the second region R2 of the second stage 30b. The conveyor belt 321 of the second stage 30b may move the magazine MZ from the second region R2 to the third region R3. The operator may eject the magazine MZ from the third region R3 of the second stage 30b. Thus, the stage 30 may function as a port, in which the magazines MZ are transferred, while functioning as the buffer in which the magazines MZ temporarily wait.

Since the pickup apparatus 10 does not move onto the third region R3 of the stage 30, the operator may be spaced apart from the pickup apparatus 10. Thus, the operator may be safe from the pickup apparatus 10.

Figure 18:
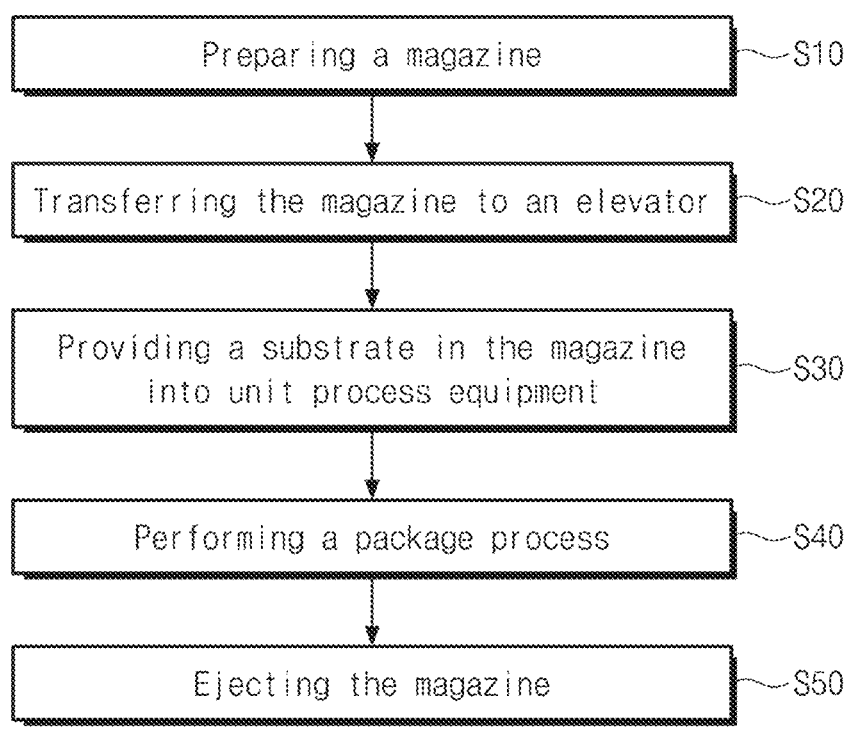
FIG. 18 is a flow chart illustrating a method of manufacturing a semiconductor package according to some example embodiments of the inventive concepts.

FIG. 18 is a flow chart illustrating a method of manufacturing a semiconductor package according to some example embodiments of the inventive concepts.

Hereinafter, for the purpose of ease and convenience in explanation, the descriptions to the same features as mentioned with reference to FIGS. 1 to 17 will be omitted and differences will be mainly described.

Referring to FIGS. 2 and 18, a method of manufacturing a semiconductor package may include preparing a magazine (S10), transferring the magazine to an elevator (S20), providing a substrate in the magazine into unit process equipment (S30), performing a package process (S40), and ejecting the magazine (S50).

The preparing of the magazine MZ (S10) may include automatically providing the magazine MZ or manually providing the magazine MZ.

More particularly, the automatic providing of the magazine MZ may be performed by the distribution apparatus. The distribution apparatus may automatically place the magazine MZ on the distribution port 50. Thereafter, the pickup apparatus 10 may transfer the magazine MZ from the distribution port 50. The manual providing of the magazine MZ may be performed by an operator. The operator may place or locate the magazine MZ on the third region R3 of the stage 30. The conveyor belt 321 of the stage 30 may move the magazine MZ from the third region R3 to the second region R2. Thereafter, the pickup apparatus 10 may transfer the magazine MZ from the stage 30.

The transferring of the magazine MZ to the elevator (S20) may include fixing the magazine MZ by the pickup apparatus 10, raising the magazine MZ in the third direction D3 by the pickup apparatus 10, reading information (or data) of the magazine MZ using the sensor unit 150 by the pickup apparatus 10, transferring the magazine MZ in the first and second directions D1 and D2 by the pickup apparatus 10, and lowering the magazine MZ on the elevator 20 in parallel to the third direction D3 by the pickup apparatus 10.

More particularly, the fixing of the magazine MZ may be performed by the fixing unit 120 of the pickup apparatus 10. The magazine MZ may be fixed in the first and second directions D1 and D2 by the fixing unit 120 of the pickup apparatus 10. The raising of the magazine MZ in the third direction D3 and the lowering of the magazine MZ in parallel to the third direction D3 may be performed by the driving unit 110 of the pickup apparatus 10. The reading of the information of the magazine MZ may include transmitting the information of the magazine MZ to the control box 1000 by the sensor unit 150. The transferring of the magazine MZ in the first and second directions D1 and D2 may be performed by the first and second rails 10a and 10b of the upper apparatus TF.

The magazine MZ may be transferred from the distribution port 50 or the stage 30 to the elevator 20. For example, when the waiting space 220s of the elevator 20 is empty, the magazine MZ may be transferred from the distribution port 50 to the elevator 20 by the pickup apparatus 10.

The providing of the substrate in the magazine into the unit process equipment (S30) may include selecting the magazine MZ and selecting the substrate.

More particularly, the magazine MZ may be located in each of the plurality of waiting spaces 220s of the elevator 20. The magazine MZ on the upper plate 220 of the elevator 20 may be moved in the first direction D1 by the fourth motor 220m and then may be aligned with the insert apparatus 40 in the second direction D2. Since the magazine MZ is aligned with the insert apparatus 40, the magazine MZ on which the package process (i.e., the semiconductor package process) will be performed may be selected.

A plurality of the substrates may be located in the magazine MZ. A substrate may be located at the same or substantially the same level as the supply robot of the insert apparatus to come in contact with the robot, and thus the substrate may be moved toward the unit process equipment 3 in the second direction D2. In other words, one of the substrates may be located at the same or substantially the same level as the supply robot of the insert apparatus and thus the substrate on which the semiconductor package process will be performed may be selected.

The unit process equipment 3 may perform the semiconductor package process (S40). The semiconductor package process may include a molding process, a marking process, an external terminal attaching process, and/or a sawing process, but example embodiments are not limited thereto.

The ejecting of the magazine (S50) may include automatically ejecting the magazine or manually ejecting the magazine.

More particularly, the automatic ejecting of the magazine MZ may be performed by the distribution apparatus. The distribution apparatus may automatically move an empty magazine MZ located on the distribution port 50 to other unit process equipment. The manual ejecting of the magazine MZ may be performed by an operator. The empty magazine MZ may be located on the second region R2 of the stage 30 by the pickup apparatus 10. The magazine MZ may be moved from the second region R2 of the stage 30 to the third region R3 of the stage 30 by the conveyor belt 321 of the stage 30. Thereafter, the operator may manually eject the magazine from the third region R3 of the stage 30.

The substrate loading apparatus according to the inventive concepts may include the elevator capable of receiving a plurality of the magazines, and the pickup apparatus. Thus, providing the substrate in the magazine into the unit process equipment and replacing the magazine may be performed at the same time by the pickup apparatus. As a result, a total time of the semiconductor package process may be reduced.

The substrate loading apparatus according to the inventive concepts may include the stage including the conveyor belt. Thus, the region where an operator may manually provide and eject the magazine may be separated from the region where the pickup apparatus is movable. As a result, the operator may safely provide and eject the magazine.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments of the inventive concepts have been particularly shown and described, it will be understood by one of ordinary skill in the art that variations in form and detail may be made therein without departing from the scope of the inventive concepts.

What is claimed is:

1. A substrate loading apparatus comprising:
   a first rail and a second rail;
   a pickup apparatus configured to move a magazine in a first direction, a second direction and a third direction;
   an elevator defining a plurality of waiting spaces;

a stage configured to support the magazine; and
an insert apparatus configured to transfer substrates from the magazine,
wherein the pickup apparatus is configured to move in the first direction by the first rail and is configured to move in the second direction by the second rail, and
wherein at least one of the plurality of waiting spaces of the elevator is configured to selectively receive the magazine, and wherein the pickup apparatus is spaced apart from the elevator and the stage in the third direction.

2. The substrate loading apparatus of claim 1, further comprising:
a distribution port, wherein the distribution port is spaced apart from the elevator in the first direction and is spaced apart from the pickup apparatus in the third direction.

3. The substrate loading apparatus of claim 1, wherein the pickup apparatus comprises:
a fixing unit configured to fix the magazine;
a driving unit configured to move the fixing unit in the third direction; and
an opening and closing unit configured to open and close a stopper of the magazine.

4. The substrate loading apparatus of claim 3, wherein the driving unit is configured to move the magazine in the third direction.

5. The substrate loading apparatus of claim 3, wherein the pickup apparatus further comprises:
a sensor unit, wherein the sensor unit is configured to identify information of the magazine.

6. The substrate loading apparatus of claim 1, wherein the elevator comprises:
a lower plate configured to move in the third direction; and
an upper plate configured to move in the first direction, the upper plate on the lower plate,
wherein the magazine is on the upper plate.

7. The substrate loading apparatus of claim 6, wherein the upper plate comprises:
a first guide defining the plurality of waiting spaces; and
a second guide configured to align substrates in the magazine.

8. The substrate loading apparatus of claim 1, wherein the stage includes a first stage and a second stage, and the magazine including substrates is on the first stage, and a magazine excluding substrates is on the second stage.

9. The substrate loading apparatus of claim 1, wherein the stage comprises:
a magazine guide on a first region of the stage; and
a conveyor belt on second and third regions of the stage.

10. The substrate loading apparatus of claim 9, wherein the conveyor belt is configured to move the magazine in the first direction.

11. The substrate loading apparatus of claim 9, wherein the pickup apparatus does not overlap with the third region of the stage when viewed in a plan view.

12. The substrate loading apparatus of claim 1, wherein each substrate includes a printed circuit board.

13. Semiconductor manufacturing equipment comprising:
a first rail and a second rail;
a substrate loading apparatus; and
unit process equipment,
wherein the substrate loading apparatus comprises:
a pickup apparatus configured to move a magazine in a first direction, a second direction and a third direction;
an elevator defining a plurality of waiting spaces;
a first stage and a second stage each configured to support the magazine;
a distribution port spaced apart from the elevator in the first direction; and
an insert apparatus comprising a supply robot configured to move a substrate into the unit process equipment,
wherein the pickup apparatus is configured to move in the first direction by the first rail and is configured to move in the second direction by the second rail, and
wherein the pickup apparatus comprises:
a fixing unit configured to fix the magazine;
a driving unit configured to vertically move the fixing unit; and
an opening and closing unit configured to open and close the magazine.

14. The semiconductor manufacturing equipment of claim 13, wherein the unit process equipment includes at least one of molding process equipment, marking process equipment, external terminal attaching process equipment, or sawing process equipment.

15. The semiconductor manufacturing equipment of claim 13, wherein the pickup apparatus is spaced upward from the elevator, the first and second stages, the distribution port and the insert apparatus.

16. A method of manufacturing a semiconductor package, the method comprising:
preparing a first magazine including substrates;
transferring the first magazine to an elevator using a pickup apparatus;
moving the substrates into unit process equipment using an insert apparatus while the first magazine is on the elevator, and performing a package process in the unit process equipment; and
ejecting the first magazine after the performing of the package process,
wherein the moving of the substrates into the unit process equipment is performed simultaneously with transferring of a second magazine to the elevator or ejecting of the second magazine from the elevator.

17. The method of claim 16, wherein the transferring of the first magazine to the elevator comprises:
raising the first magazine in a vertical direction using the pickup apparatus while fixing the first magazine using the pickup apparatus;
reading information of the first magazine by using a sensor unit;
moving the first magazine in first and second directions to place the first magazine on the elevator; and
lowering the first magazine in the vertical direction.

18. The method of claim 16, wherein the preparing of the first magazine comprises at least one of:
automatically placing the first magazine on a distribution port using a distribution apparatus, or
manually receiving the first magazine on a stage from an operator.

19. The method of claim 16, wherein the ejecting of the first magazine comprises at least one of:
automatically ejecting the first magazine from a distribution port using a distribution apparatus, or
manually ejecting the first magazine from a stage via an operator.

* * * * *